United States Patent [19]

Takahashi et al.

[11] Patent Number: 4,748,050
[45] Date of Patent: May 31, 1988

[54] PROCESS FOR PREPARING THIN FILM HAVING HIGH LIGHT TRANSMITTANCE

[75] Inventors: Shigeyuki Takahashi; Kaoru Yamaki; Takayuki Kuroda, all of Himeji, Japan

[73] Assignee: Daicel Chemical Industries, Ltd., Sakai, Japan

[21] Appl. No.: 806,145

[22] Filed: Dec. 6, 1985

[30] Foreign Application Priority Data

Aug. 9, 1985 [JP] Japan .................................. 60-175249

[51] Int. Cl.$^4$ ............................................... B05D 5/06
[52] U.S. Cl. ................................... 427/164; 427/171; 427/209; 427/248.1; 427/294
[58] Field of Search ............ 427/171, 164, 166, 248.1, 427/419.2, 294, 209

[56] References Cited

U.S. PATENT DOCUMENTS

| | | | |
|---|---|---|---|
| 2,466,119 | 4/1949 | Moulton et al. | 427/164 |
| 2,628,921 | 2/1953 | Weinrich | 427/164 |
| 2,758,948 | 8/1956 | Simon | 427/164 |
| 3,356,522 | 12/1967 | Libbert | 427/164 |
| 3,475,192 | 10/1969 | Langley | 427/164 |
| 3,944,440 | 3/1976 | Franz | 427/164 |
| 3,958,042 | 5/1976 | Katsube et al. | 427/164 |
| 4,172,156 | 10/1979 | Ritter et al. | 427/164 |
| 4,252,843 | 2/1981 | Dorer et al. | 427/164 |

FOREIGN PATENT DOCUMENTS 55-47381 11/1980 Japan .................................. 427/171

Primary Examiner—Janyce A. Bell
Attorney, Agent, or Firm—Flynn, Thiel, Boutell & Tanis

[57] ABSTRACT

A thin coated film having a transmittance of 96% or more for light having a particular wavelength in a range of 300 to 700 nm is prepared by coating one or both surfaces of a thin film of a transparent resin having a uniform thickness of 0.5 to 10 μm with a colorless metal fluoride or oxide all over the area thereof with a thickness of about 100 nm while holding the thin film in a uniformly tensional state.

13 Claims, 1 Drawing Sheet

PROCESS FOR PREPARING THIN FILM HAVING HIGH LIGHT TRANSMITTANCE

BACKGROUND OF THE INVENTION

1. Field of the Invention

The present invention relates to a process for preparing a thin transparent resin film having a high light transmittance which is suitable as a dust cover of a photomask.

2. Description of the Prior Art

In the production of integrated circuits, a projection printing method is employed which comprises projecting a pattern drawn over a photomask on a silicon wafer coated with a resist by using light to effect light deterioration or light hardening of the resist in the portions corresponding to the pattern. When some undesirable adherent matter, i.e. dust, is present on the photomask, it is projected on the wafer. In order to avoid such an influence of the dust, a method for using a dust cover of a thin resin film is known in U.S. Pat. No. 4,131,363. The cover serves to improve the yield of integrated circuit chips produced and reduces the number of times required to clean a photomask. That way the service life extends.

The projection printing method now includes new modes, which involves respective determined thicknesses of thin films suitable as the dust covers for the respective modes. More specifically, a thin film having a thickness of 2.86±0.2 μm in the case of a projection mode (light exposure with equal magnification) and 0.87±0.02 μm in the case of a stepper mode (light exposure with reduced magnification). This condition of thickness is a requisite for securing a light transmittance of 96% or more in the thin film in the case of g line (436 μm) as the light source used for light exposure. The reason will now be explained in conjunction with the accompanying drawings.

In FIG. 1, the solid line curve (a) shows light transmittance of a thin cellulose nitrate film having a thickness of 2.90 μm, which is plotted against the wavelength, the light transmittance curve has a wavy form having peaks showing a light transmittance of approximately 100% and bottoms showing a light transmittance of only about 80%. Part of the light is reflected at the interface between the film and air to go backward, and part of the reflected light is reflected from the interface between the film and air on the reverse side to advance forward. The advancing light after reflecting twice is delayed, in advancement, by twice the film thickness as compared with directly transmitted light. Thus the two advancing lights have the same wavelengths but provide a phase difference to cause mutual interference leading to loss of light transmittance. When the film thickness is 2.86±0.2 μm, the g radiation transmittance appears around the the peak. However, this cannot be attained if the film thickness varies, since a change in the film thickness causes a shift of the light transmittance curve rightward or leftward. FIG. 1 also shows light transmittance of a thin cellulose nitrate film having a thickness of 0.90 micron with a dot-dash line (b).

Even if the influence of dust can be obviated by providing a dust cover, the amount of light for effecting projection must not be reduced by the dust cover. U.S. Pat. No. 4,131,363 also discloses an instance of a light exposure apparatus including a plurality of dust covers, each of which preferably has a light transmittance of 96% or more. Such covers must be prepared from a highly transparent, non-oriented material of thin film with a high precision of a predetermined and constant film thickness. Since the thin film has an extremely small thickness of 10 μm or less, it must be held by a support frame in a uniformly tensional state thereof.

Japanese Patent Laid-Open No. 219023/1983 discloses a method of preparing such a thin film from cellulose nitrate and a method of holding such a thin film. More particularly, it discloses a process for preparing a thin, non-oriented cellulose ester film kept in a uniformly tensional state, characterized by comprising the step of casting a solution of a cellulose ester dissolved in an organic solvent over a smooth glass plate and removing the solvent to form a thin film having a uniform thickness on the glass plate, the step of separating the thin film from the glass plate in water, and the step of recovering the thin film from the water, holding the thin film in a wet state on a support frame, and drying the thin film. Thus, the so-called casting method is employed in this process to obtain the non-oriented film. Since the cellulose ester is easily dissolved in a relatively low boiling point solvent such as a ketone or an ester of lower aliphatic acid, a thin film having a predetermined final thickness can be prepared by controlling the concentration of a solution and the casting thickness. A film having a constant thickness of 2.8±0.3 μm, 4.5±0.3 μm, or the like is used as the thin photomask-protecting film.

When a smooth glass plate used in casting, as the casting substrate is immersed in water after removal of the solvent, a thin film is spontaneously stripped off, so that it can be easily recovered. When the thin film thus recovered is directly mounted on a support frame, and coated, in a damp-dry state, with a small amount of a volatile solvent along the portion of the film in contact with the support frame, followed by drying, a uniformly tensional supporting state can be secured due to the slight shrinkage of the film as well as the adhesion of the film to the support frame.

With recent progress in the semiconductor industry, there is a trend toward increases in the density and scale of integration of integrated circuits. Accordingly, the line width and interlinear distance of a projected pattern on a wafer tend to be decreased.

As a result, h line (406 μm) or i line (365 μm) having a shorter wavelength and a higher energy than the g line has often been used as the exposure light source. Resists capable of being rendered photosensitive by respective lights alone have also been increasingly employed properly. Thus, if conventional types of thin films as the dust covers are to be used, those having a variety of film thicknesses adapted to respective light sources must be prepared and properly used according to objectives.

SUMMARY OF THE INVENTION

As a result of intensive investigations, the inventors of the present invention have found that, if the influence of twice reflected light in the film is eliminated, a thin film is obtained which has high transmittances for all radiations of exposure light source, that is, g, h, and i lines, and which obviates the influence of a slight variation of film thickness. More specifically, a thin coated film having a transmittance of 96% or more for a light having a wavelength of 300 to 700 nm can be obtained by coating one or both surfaces of the thin film with a transparent substance having a lower refractive index than that of the material of the thin film with a thickness of about 100 nm.

DETAILED DESCRIPTION OF PREFERRED EMBODIMENTS

Figure 1:
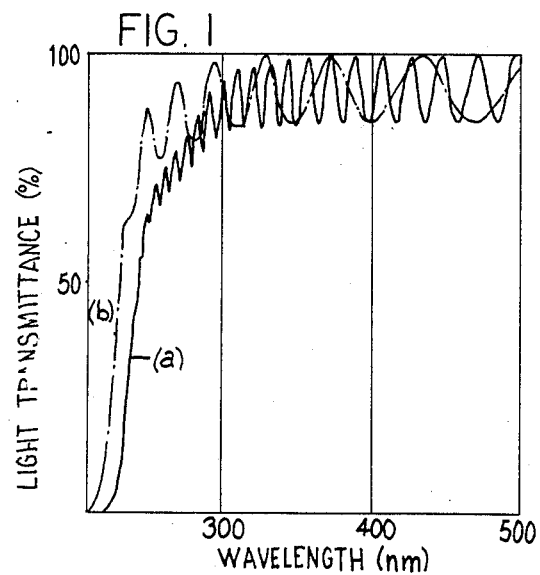
FIG. 1 is a graph showing light transmittances of thin cellulose nitrate films having thicknesses of 2.90 μm and 0.90 μm, respectively, which are plotted against the wavelength.

Cellulose derivatives are suitable as a thin resin film to be used in the present invention. The cellulose derivatives have high light transmittances, particularly in the near ultraviolet region, and a small tendency of orientation during molding. The cellulose derivatives include cellulose nitrate, cellulose acetate, cellulose acetate butyrate, cellulose acetate propionate, cyanoethyl cellulose and cellulose propionate. Cellulose nitrate is particularly excellent. Substances other than cellulose derivatives that can be used for preparation of a thin resin film include polyethylene terephthalate, polyvinyl chloride, polyvinylidene chloride, polystyrene, polymethyl acrylate, and polycarbonate.

The substance constituting the surface coating layer for the thin resin film can be selected from among transparent inorganic materials such as metal fluorides and oxides. For the purpose of eliminating the influence of interference of reflected light, a substance having a lower refractive index than the material of the thin resin film must be used. Moreover, since a refractive index of a cellulose derivative in a wavelength band of 300 to 700 nm used in light exposure is about 1.50 to 1.55, a coating substance preferably includes calcium fluoride (refractive index at 436 nm: 1.23, the same applies hereinbelow), barium fluoride (1.3), sodium fluoride (1.34), and magnesium fluoride (1.38). A substance having a refractive index of 1.3 or less is particularly suitable for the purpose of the present invention. Since the thin resin film has a very small thickness, an external force may vibrate the film even if the film is held under a uniform tension. If the film does not have a flexibility or a suppleness enough to follow the vibration, there arises a danger of cracking in the coating layer. Calcium fluoride is particularly useful in practicing the present invention since it has an adequate flexibility in addition to an advantage thereof in refractive index. Furthermore, calcium fluoride has another advantage that it has a comparatively low moisture absorption. The mechanism of reflection prevention on the surface coating layer is believed to be as follows. In the case of single-side coating, a coating layer is provided on the side of the thin film from which light comes out. In this case, since the difference in refractive index between the film and the coating layer is smaller than that between the film and air, the reflectivity of the interface between the film and the coating is smaller than of the interface between the film and air, namely, the reflectivity in the case of no coating layer. However, reflection may also occur in the interface between the coating layer and air. When the thickness of the coating layer is ¼ of the wavelength of light, the reflected light from the interface between the film and the coating layer and the one from the interface between the coating layer and air mutually interfere with a difference of just half the wavelength. Thus, the reflected lights themselves are attenuated. In the same way, double-side coating may attenuate the secondary reflected light to have a negligible intensity, and the interference effect against straightly advancing transmitted light is further decreased. As a result, the wavy form in the transmittance-wavelength curve substantially disappears, and high transmittances can be obtained all over the wavelength region.

Coating of a thin film is performed by vacuum vapor deposition. More specifically, a coating material is heated in a vacuum of $10^{-3}$ to $10^{-5}$ Torr, and a generated vapor is deposited on the thin film. During the course of vacuum deposition, a monitoring system may be employed which is developed to enable vacuum deposition to be effected while measuring the reflectivity for light having a particular wavelength of, for example, g line (436 nm) from the side opposite the surface on which a coating layer is being formed. When a thickness of ¼ of the wavelength of light is attained in the coating, the intensity of the reflected light is minimized. The coating has only to be ended at this point. After the completion of coating on one surface, the thin film turned upside down may be subjected to the same coating as described above to achieve double-side coating.

A dust cover having high transmittances over a whole range of 300 to 700 nm can be obtained by forming an adequate coating on an adequate thin film.

The thin coated film obtained according to the process of the present invention is not so severe in selectivity of film thickness as compared with a thin film having no coating layer. Thus the yield in the preparation of dust covers is improved. Furthermore, the use of one dust cover can deal with radiations with different wavelengths, such as g line, h line, and i line. Moreover, since the surface hardness of the coating layer is higher than that of the resin, the durability of the dust cover is improved. In this respect, a thin double-side coated film is particularly excellent.

As described above, the present invention provides a process for preparing a thin coated film having a transmittance of 96% or more for light having a particular wavelength in a range of 300 to 700 nm, which comprises applying a colorless metal fluoride or oxide on one or both surfaces of a thin film of transparent resin having a uniform thickness of 0.5 to 10 μm, all over the area thereof to a thickness of about 100 nm, while holding the film in a uniformly tensional state.

In the present invention described above, the following thin double-coated film works very well. A coating layer having a low moisture absorption or one having a small crystallization tendency may be provided on the outer surface of the calcium fluoride coating layer to prevent changes with time.

Thus, this kind of thin film is provided in accordance with a process for preparing a thin coated film having a transmittance of 96% or more for light having a particular wavelength in a range of 300 to 700 nm, which comprises coating one or both surfaces of a thin film of a transparent resin having a uniform thickness of 0.5 to 10 μm with a colorless metal fluoride or oxide all over the area thereof with a thickness of about 100 nm while holding the film in a uniformly tensional state, in which the coating provides a double-layer structure consisting of a layer of calcium fluoride on the side of the resin and a layer of magnesium fluoride or silicon dioxide on the outer side.

In the case of the double coating process as a preferred embodiment of the invention, the coating layer may be obtained by the method as described above, which has only to be so practiced as to provide a total thickness of the two-layers of about ¼ of the wavelength of light. In the case of the double layer coating, the first coating of calcium fluoride may be ended when 80 to 90% of the coating operation is accomplished judging from the conditions for obtaining a thickness of ¼ of the wavelength which is preliminarily determined. In this case, the calcium fluoride source being heated is shielded and switched over to a coating material of the second layer. Vacuum deposition is started again and continued. Coating of a second layer is ended when the intensity of the reflected light is minimized according to the monitoring as described above.

The presence of silicon dioxide having a low moisture absorption or magnesium fluoride having a small crystallization tendency on the outer surface of the calcium fluoride layer to prevent calcium fluoride from being in direct contact with air is effective in prolonging the service life of the dust cover. In this case, the flexibility of silicon dioxide or magnesium fluoride may be poorer than that of calcium fluoride. The presence of calcium fluoride in the internal layer decreases the extent of vibration of the thin film. Therefore, the durability of the dust cover is improved as compared to the case where a coating layer of silicon dioxide or magnesium fluoride is directly applied onto the thin film.

The present invention will now be illustrated with reference to the following Examples, to which the present invention is not limited.

PREPARATION OF THIN CELLULOSE NITRATE FILM

A cellulose nitrate dope composed of 64 g of cellulose nitrate RS-5 (manufactured by Daicel Ltd., wetted with isopropanol, solid content: 70%), 146 g of methyl ethyl ketone, 120 g of butyl acetate, and 120 g of toluene is applied onto a smooth glass by using a bar coater having a clearance of 50 μm, allowed to stand at room temperature (20° C.) for 24 hours to effect drying, and further dried at 60° C. for 1 hour. Cellulose nitrate dried into a film was gently immersed in clear water together with the glass plate. When they are allowed to stand for some time, a cellulose nitrate film spontaneously peels off. The film is scooped up by using a circular aluminum frame having a diameter of about 100 mm while avoiding collapse of the form of the film. A portion of the film inside the frame is mounted on the upper side of an aluminum support frame having an internal diameter of 61 mm, an external diameter of 65 mm, and a thickness of 3 mm. Subsequently, a small amount of methyl ethyl ketone is applied along the interface of the film in contact with the frame, followed by air drying. Thus the film is stuck to the support frame. The portion of the film protruding out of the support frame is cut off. The remaining film is dried at 60° C. for 3 hours to obtain a cellulose nitrate film having a thickness of 2.90 μm (specific gravity: 1.6) and supported with a uniform tension.

The thickness of the support frame acts as a spacer providing a given space in an optical path between the image area of a photomask and the thin resin film.

[Embodiments]

EXAMPLE 1

Figure 2:
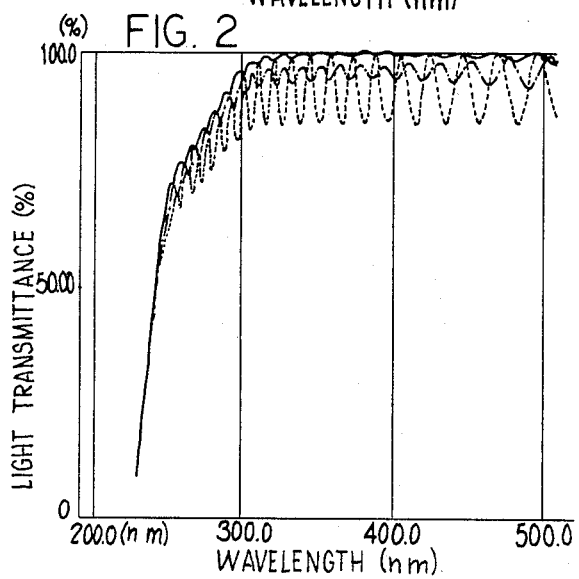
FIG. 2 is a graph showing light transmittances of a thin film having a thickness of 2.90 μm designated by a dashed line (-----), a thin single-side coated film designated by a broken line (--------), and a thin double side coated film designated by a solid line (----) obtained in Example 1, which are plotted against wavelengths.

A thin cellulose nitrate film having a thickness of 2.90 μm, which was obtained according to the above-mentioned method, was supported on a circular frame having an internal diameter of 61 mm, an external diameter of 65 mm, and a height of 3 mm. The light transmittances of this film are shown with a dashed line (----) in FIG. 2.

Coating with calcium fluoride was made on the thin film. The coating was continued till the reflectivity was minimized in monitoring with a light of 438 nm by using a Shincron vacuum deposition apparatus (Shinku Kikai Kogyo K. K.). The thickness of the coating layer was about 110 nm. The light transmittances of the thin single-side coated film are shown with a broken line (-------) in FIG. 2.

The thin single-side coated film was turned upside down, and further subjected to the same coating as described above to form a thin double-side coated film. The light transmittances of the obtained film are shown with a solid line (----) in FIG. 2.

As to three exposure light sources, that is, g line (436 nm), h line (406 nm), and i line (365 nm), the single-side coated film showed a light transmittance of 96% or more, and the double-side coated film showed a light transmittance of 98% or more.

Using an air gun giving an air pressure of 3 Kg/cm$^2$ from a distance of 1 cm, air was blown against the thin coated films for one minute. Neither cracking nor falling of the coating layers was observed.

Figure 3:
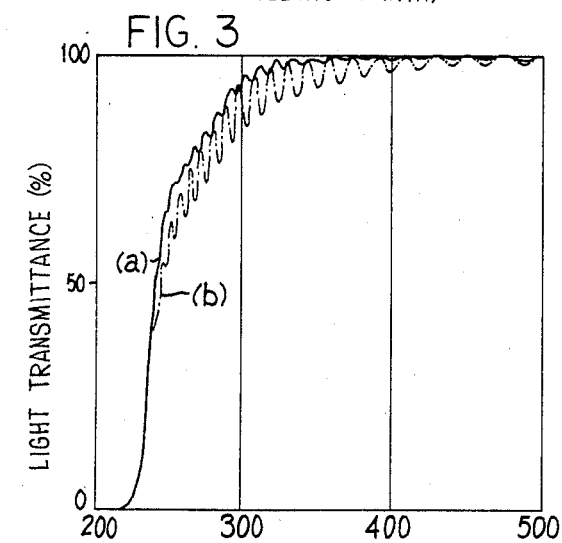
FIG. 3 is a graph showing light transmittance of a thin double-side coated film obtained in Example 1, plotted against wavelengths. It was measured after being allowed to stand (a) 60% RH and (b) 90% RH for one month of the coating.

Pieces of the thin double-side coated film were allowed to stand in atmospheres of (a) 22° C. and 60% RH, and (b) 22° C. and 90% RH. After one month and three months, the light transmittances of the film were measured. The results of the measurement are shown in Table 1. The piece of the thin double-side coated film allowed to stand in an atmosphere of 22° C. and 60% RH showed no substantial changes, while the piece allowed to stand in an atmosphere of 22° C. and 90% RH showed light transmittances of 96% or less. Light transmittance of the thin coated film is shown in FIG. 3. The solid line (a) shows that after of the film which had been allowed to stand at 60% RH for one month of the coating and the broken line (b), at 90% RH.

EXAMPLE 2

According to the aforementioned method, a thin cellulose nitrate film having a thickness of 2.90 μm was prepared and supported on a circular frame having an internal diameter of 61 mm, an external diameter of 65 mm and a height of 3 mm. Coating with calcium fluoride to form a first layer was conducted on the above-mentioned thin film by using a Shincron vacuum deposition apparatus (Shinku Kikai Kogyo K. K.). The coating time was 90 seconds. Subsequently, coating with magnesium fluoride was conducted on the first coating layer till the reflectivity for light of 438 nm was minimized. The coating time for the second coating layer was 30 seconds. The total thickness of the first and second coating layers was about 110 nm.

Figure 4:
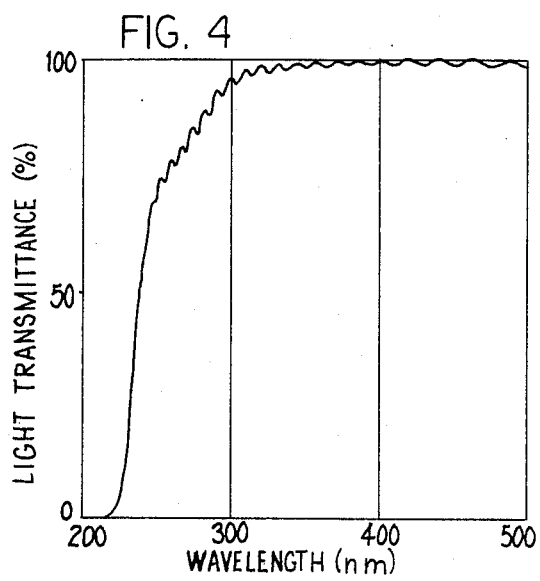
FIG. 4 is a graph showing light transmittance of a thin double layer-coated film obtained in Example 2, plotted against wavelengths.

Subsequently, the thin single-side coated film was turned upside down, and further subjected to the same coating as described above to form a thin double-side coated film. The light transmittances of the film thus obtained are shown in FIG. 4. As is apparent from FIG. 4, the thin double-side coated film showed light transmittances of 98% or more, specifically 99%, 99% and 98% for g line (436 nm), h line (406 nm), and i line (365 nm), respectively, as the exposure light source. Using an air gun giving an air pressure of 3 Kg/cm² from a distance of 1 cm, air was blown against the thin double-side coated film for one minute. Neither cracking nor falling of the coating layer was observed.

Pieces of the thin double-side coated film were allowed to stand in respective atmospheres of (a) 22° C. and 60% RH, and (b) 22° C. and 90% RH. After one month and three months, the light transmittances of the film were measured. No substantial changes were observed. The results are shown in Table 1.

EXAMPLE 3

Coating of a first layer with calcium fluoride and a second layer with silicon dioxide was conducted in the same manner as in Example 2 to obtain a thin double side coated cellulose nitrate film having a total coating thickness of the first and second layers of about 110 nm and supported on the same circular frame as in Example 2.

Some samples of the thin double layer-coated film were allowed to stand in respective atmospheres of (a) 22° C. and 60% RH, and (b) 22° C. and 90% RH, and then subjected to measurement of light transmittance. The results are shown in Table 1.

EXAMPLE 4

Figure 5:
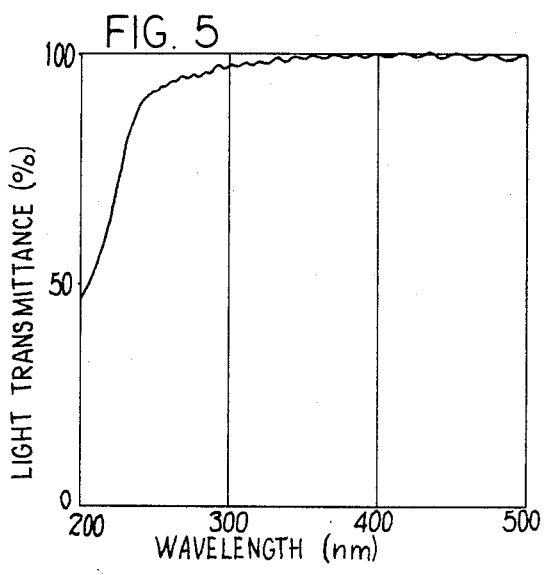
FIG. 5 is a graph showing light transmittance of a thin, double layer-coated film obtained in Example 4, plotted against wavelengths.

Coating of a first layer with calcium fluoride and a second layer with magnesium fluoride was conducted in substantially the same manner as in Example 2 except that a thin cellulose acetate propionate film was used instead of the thin cellulose nitrate film. Thus, there was obtained a thin double layer-coated cellulose acetate propionate film having a total coating thickness of the first and second layers of about 110 nm and supported on the same circular frame as in Example 2. The light transmittances of the thin film are shown in FIG. 5.

Some samples of the thin double-side coated film were allowed to stand in respective atmospheres of (a) 22° C. and 60% RH, and (b) 22° C. and 90% RH, and then subjected to measurement of light transmittance in the same manner as in Example 2. The results are shown in Table 1.

TABLE 1

| | | Period of measurement Light transmittance** Atmosphere of place of standing (°C. % RH) | | | | | |
|---|---|---|---|---|---|---|---|
| | | Just after coating | | One month after coating | | Three months after coating | |
| | Thin double-side coated film* | 22° C. 60% RH | 22° C. 90% RH | 22° C. 60% RH | 22° C. 90% RH | 22° C. 60% RH | 22° C. 90% RH |
| EX. 1 | $CaF_2/NC/CaF_2$ | O | O | O | X | O | X |
| EX. 2 | $MgF_2/CaF_2/NC/CaF_2/MgF_2$ | O | O | O | O | O | O |
| EX. 3 | $SiO_2/CaF_2/NC/CaF_2/SiO_2$ | O | O | O | O | O | O |
| EX. 4 | $MgF_2/CaF_2/CAP/CaF_2/MgF_2$ | O | O | O | O | O | O |

*NC; cellulose nitrate
CAP; cellulose acetate propionate
$CaF_2$; calcium fluoride
$MgF_2$; magnesium fluoride
$SiO_2$; silicon dioxide
**O: light transmittance of 96% or more for g, h and i lines
X: light transmittance of less than 96% for g, h and i lines

What is claimed is:

1. A process for preparing a thin coated film, which comprises coating, by vacuum vapor deposition, a thin film of a transparent resin selected from the group consisting of cellulose nitrate, cellulose acetate propionate, cellulose acetate butyrate, cellulose acetate, cellulose propionate and cyanoethyl cellulose and having a uniform thickness of 0.5 to 10 μm, with a colorless metal fluoride or oxide to a thickness of about 100 nm or one or both surfaces of said thin film while holding said thin film in a uniformly tensioned state.

2. A process for preparing a thin coated film as claimed in claim 1, wherein said coating comprises a double layer structure consisting of a layer of calcium fluoride deposited on said resin and a layer of magnesium fluoride or silicon dioxide deposited on said calcium fluoride layer.

3. A process for preparing a thin coated film as claimed in claim 1, wherein said thin film is made of cellulose nitrate, and the coating is calcium fluoride.

4. A process for preparing a thin coated film, comprising holding a 0.5–10 μm thick film of a transparent resin in a uniformly tensioned state and coating by vapor deposition at least one surface of said film with a coating of a fluoride or oxide of a metal selected from the group consisting of calcium fluoride, barium fluoride, sodium fluoride, magnesium fluoride and silicon dioxide to a thickness of about 100 nm, by heating said oxide or fluoride of metal in a vacuum of from $10^{-3}$–$10^{-5}$ Torr, under conditions effective for vacuum vapor deposition of said coating on said transparent resin, wherein said metal is deposited in its fluoride or oxide state, the resulting coated film having a transmittance of 96% or more for light having a wavelength in the range of 300–700 nm.

5. A process as claimed in claim 4, wherein said coating is transparent to radiation having a wavelength of 436 μm.

6. A process as claimed in claim 4, wherein said thin film comprises a transparent resin selected from the group consisting of cellulose nitrate, cellulose acetate propionate, cellulose acetate butyrate and cyanoethyl cellulose.

7. A process for preparing a thin transparent resin film having a high light transmittance of 96% or higher, for light having a wavelength of from 300 to 700 nm, which comprises the steps of:

forming a thin, nonoriented, substrate film having a thickness of from 0.5 to 10 μm of a transparent resin having a refractive index, at 300 to 700 nm, in the range of from about 1.50 to about 1.55, said resin being selected from the group consisting of cellulose nitrate, cellulose acetate, cellulose propionate, cellulose acetate propionate, cellulose acetate butyrate and cyanoethyl cellulose, and supporting said substrate film on a frame so that said substrate film is in a uniformly tensional state, then coating, by vacuum vapor deposition, one or both surfaces of said substrate film with a coating layer consisting of transparent material having a refractive index lower than that of said transparent resin and selected form the group consisting of calcium fluoride, barium fluoride, sodium fluoride and magnesium fluoride, said coating layer having a thickness such that the light transmittance of said coated transparent resin film is 96% or higher, for light having a wavelength of from 300 to 700 nm.

8. A process as claimed in claim 7 in which the thickness of said coating layer is about ¼ of the wavelength of the light that is to be transmitted through said thin transparent resin film.

9. A process as claimed in claim 7 in which the thickness of said coating layer is about 100 nm.

10. A process as claimed in claim 7 in which said transparent material has a refractive index of less than 1.3.

11. A process as claimed in claim 7 in which said thin substrate film consists of cellulose nitrate and said coating layer consists of calcium fluoride.

12. A process as claimed in claim 7 in which said thin substrate film consisting of cellulose nitrate and said coating layer consists of a first sublayer of calcium fluoride deposited on said substrate film and a second sublayer of magnesium fluoride or silicon dioxide deposited on said first sublayer.

13. A process as claimed in claim 7 in which a coating layer is coated on both surfaces of said substrate film.

* * * * *

UNITED STATES PATENT AND TRADEMARK OFFICE
CERTIFICATE OF CORRECTION

PATENT NO. : 4,748,050
DATED : May 31, 1988
INVENTOR(S) : Shigeyuki TAKAHASHI et al It is certified that error appears in the above-identified patent and that said Letters Patent is hereby corrected as shown below:

Column 8, line 35; change "or" (last occurrence) to ---on---.
Column 10, line 17; change "consisting" to ---consists---.

Signed and Sealed this

Thirteenth Day of September, 1988

Attest:

DONALD J. QUIGG

*Attesting Officer*       *Commissioner of Patents and Trademarks*